US010187078B2

(12) United States Patent
Liu

(10) Patent No.: US 10,187,078 B2
(45) Date of Patent: Jan. 22, 2019

(54) DATA CONVERTERS FOR MITIGATING TIME-INTERLEAVED ARTIFACTS

(71) Applicant: QUALCOMM Incorporated, San Diego, CA (US)

(72) Inventor: Edward Wai Yeung Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/650,300

(22) Filed: Jul. 14, 2017

(65) Prior Publication Data

US 2018/0226983 A1  Aug. 9, 2018

Related U.S. Application Data

(60) Provisional application No. 62/454,438, filed on Feb. 3, 2017.

(51) Int. Cl.
| | |
|---|---|
| *H03M 1/00* | (2006.01) |
| *H03M 1/34* | (2006.01) |
| *H03M 1/08* | (2006.01) |
| *H03M 1/12* | (2006.01) |
| *H03M 1/10* | (2006.01) |
| *H04B 17/10* | (2015.01) |

(52) U.S. Cl.
CPC ........... *H03M 1/34* (2013.01); *H03M 1/0836* (2013.01); *H03M 1/1061* (2013.01); *H03M 1/1215* (2013.01); *H04B 17/101* (2015.01)

(58) Field of Classification Search
CPC .... H03M 1/34; H03M 1/1061; H03M 1/0836; H03M 1/1215; H03M 1/10; H03M 1/12; H04B 17/101

USPC .................................. 341/118–120, 126, 161
See application file for complete search history.

(56) References Cited

U.S. PATENT DOCUMENTS

| | | | | |
|---|---|---|---|---|
| 4,968,988 A | * | 11/1990 | Miki ................... | H03M 1/0651 341/118 |
| 7,394,415 B2 | * | 7/2008 | Fuse ................... | H03M 1/1038 341/120 |
| 8,224,374 B2 | | 7/2012 | Kato et al. | |
| 8,595,672 B2 | * | 11/2013 | Herbst .................... | A61N 1/08 716/116 |
| 8,600,435 B2 | | 12/2013 | Eisenhut et al. | |
| 8,730,072 B2 | | 5/2014 | Petigny et al. | |
| 9,294,112 B1 | | 3/2016 | Devarajan et al. | |

(Continued)

FOREIGN PATENT DOCUMENTS

| | | |
|---|---|---|
| CN | 103368590 A | 10/2013 |
| WO | 2014135685 A1 | 9/2014 |

OTHER PUBLICATIONS

Anonymous, "System and Method for Generating and Receiving Time-Aligned Multiple Channels Using High Bandwidth Data Converters", IP.com No. IPCOM000170282D, IP.com Electronic Publication Date: May 14, 2008, pp. 1-10.

(Continued)

*Primary Examiner* — Jean B Jeanglaude
(74) *Attorney, Agent, or Firm* — Qualcomm Incorporated/Seyfath Shaw LLP

(57) ABSTRACT

A data converter includes multiple subunits to convert an input such as a radio frequency (RF) signal. The subunits are selected to sample the input in an order that varies over time. Two or more subunits are enabled at the same time. The selected subunits are configured to convert the input from an analog signal to a digital signal or vice versa.

24 Claims, 11 Drawing Sheets

(56) References Cited

U.S. PATENT DOCUMENTS

| | | | | |
|---|---|---|---|---|
| 2008/0019710 | A1* | 1/2008 | Takeyama | G03G 15/55 |
| | | | | 399/12 |
| 2011/0248318 | A1* | 10/2011 | Herbst | A61N 1/32 |
| | | | | 257/208 |
| 2012/0277680 | A1* | 11/2012 | Woehr | A61M 25/0618 |
| | | | | 604/164.08 |
| 2014/0240158 | A1* | 8/2014 | Ishii | H03M 1/1023 |
| | | | | 341/161 |
| 2015/0282099 | A1 | 10/2015 | Laaser | |
| 2015/0326240 | A1* | 11/2015 | Tousi | H03M 1/1038 |
| | | | | 341/118 |

OTHER PUBLICATIONS

Behzad R., "Design Considerations for Interleaved ADCs," IEEE Journal of Solid State Circuits, Aug. 2013, vol. 48, No. 9, pp. 1805-1817.

Doris K., et al., "A 480mW 2.6GS/s 10b 65nm CMOS Time-Interleaved ADC with 48.5dB SNDR up to Nyquist," Digest of ISSCC, 2011, pp. 180-181.

Dortz N.L., et al., "A 1.62GS/s Time-Interleaved SAR ADC with Digital Background Mismatch Calibration Achieving Interleaving Spurs Below 70dBFS," Digest of ISSCC, 2014, pp. 386-387.

Dyer K., et al., "Analog Background Calibration of a 10b 40MSample/s Parallel Pipelined ADC," Digest of ISSCC, 1998, pp. 142-143.

International Search Report and Written Opinion—PCT/US2018/012417—ISA/EPO—dated May 16, 2018.

Nairn D.G., "Time-Interleaved Analog-to-Digital Converters", Custom Integrated Circuits Conference, 2008, CICC 2008, IEEE, IEEE, Piscataway, NJ, USA, Sep. 21, 2008, pp. 289-296, XP031361463, ISBN: 978-1-4244-2018-6.

Poulton K., et al., "A 1-GHz 6-bit ADC System," IEEE Journal of Solid State Circuits, Dec. 1987, vol. SC-22, No. 6, pp. 962-970.

* cited by examiner

US 10,187,078 B2

DATA CONVERTERS FOR MITIGATING TIME-INTERLEAVED ARTIFACTS

CROSS-REFERENCE TO RELATED APPLICATION

The present application claims the benefit of U.S. Provisional Patent Application No. 62/454,438, filed on Feb. 3, 2017, and titled "DATA CONVERTERS FOR MITIGATING TIME-INTERLEAVED ARTIFACTS," the disclosure of which is expressly incorporated by reference herein in its entirety.

BACKGROUND

Technical Field

The present disclosure relates generally to electronic circuitry, and more specifically to data converters.

Background

A wireless device (e.g., a cellular phone or a smartphone) in a wireless communication system may transmit and receive data for two-way communication. In the process, the data signals communicated may be converted from an analog signal to a digital signal and vice versa. In a time-interleaved analog-to-digital converter (ADC), the signal-to-noise and distortion ratio (SNDR) determines the effective number of bits, and the spurious free dynamic range (SFDR) determines the dynamic range with consideration for spurs. For high performance systems with multiple sub-carriers, such as the orthogonal frequency division multiplexing (OFDM) family, spurs at a specific sub-carrier may cause high error rate at that sub-carrier. Therefore, for low error rates, low spurs are desired, resulting in stringent SFDR specifications. A time-interleaved ADC achieves a high sampling rate (fs) by interleaving N sub-ADC's. Unfortunately, the mismatches between sub-ADCs may cause spurs that reduce SFDR and SNDR, and decrease performance.

SUMMARY

In an aspect of the present disclosure, a data converter is presented. The data converter includes multiple subunits to convert an input. The subunits are selected to sample the input in an order that varies over time. Two or more of the subunits are enabled at the same time.

In another aspect of the present disclosure, a method of data conversion is presented. The method includes simultaneously selecting multiple subunits to convert an input signal. The subunits are selected according to a variable hopping frequency. One of the subunits is enabled for calibration.

In yet another aspect of the present disclosure, a data converter is presented. The data converter includes means for simultaneously selecting multiple subunits to convert an input signal. The subunits are selected according to a variable hopping frequency. One of the subunits is enabled for calibration. The data converter further includes means for calibrating non-selected subunits during a period in which the selected subunits perform data conversion.

In yet still another aspect of the present disclosure, a wireless communication device is presented. The wireless communication device includes a data converter. The data converter includes multiple subunits that convert an input. The subunits are selected in an order that varies over time. Two or more of the subunits are enabled at the same time.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

Aspects and features of the present disclosure will be more apparent by describing example aspects with reference to the accompanying drawings, in which.

DETAILED DESCRIPTION

While a number of inventive aspects are described herein, these aspects are presented by way of example only, and are not intended to limit the scope of protection. The apparatuses and methods described herein may be embodied in a variety of other forms. Furthermore, various omissions, substitutions, and changes in the form of the example apparatuses and methods described herein may be made without departing from the scope of protection.

In accordance with aspects of the present disclosure, methods for mitigating time-interleaved ADC artifacts are presented. In one aspect, a sampling frequency hopping process achieves good SFDR, which is difficult to achieve with a time interleaving ADC. The hopping pattern may be based on a pseudorandom binary sequence (PRBS), for example. Based on the hopping pattern, a phase selector may be driven (e.g., via a finite state machine) to choose a specific sub-ADC. The ADC output samples may, in turn, follow a random order, so an output selector will sort them into the normal order. In another aspect, a finite state machine, for example, may drive the phase selector to choose a specific sub-ADC to sample the input and may drive a phase selector at the same phase to calibrate the unselected sub-ADC in the same time interval, resulting in SNDR improvement.

In yet another aspect of the present disclosure, a timing skew calibration process may be implemented to further improve performance. In one example, the output of a data converter channel under calibration may be measured at the highest slope. The output at the highest slope may be compared to an output of a reference channel. The difference between the outputs (e.g., the output of the channel being calibrated and the reference channel output) provides the sign of the timing skew. In turn, a finite state machine may be employed to converge to a correct trim code with a successive approximation process based on the sign of the timing skew.

Figure 1:
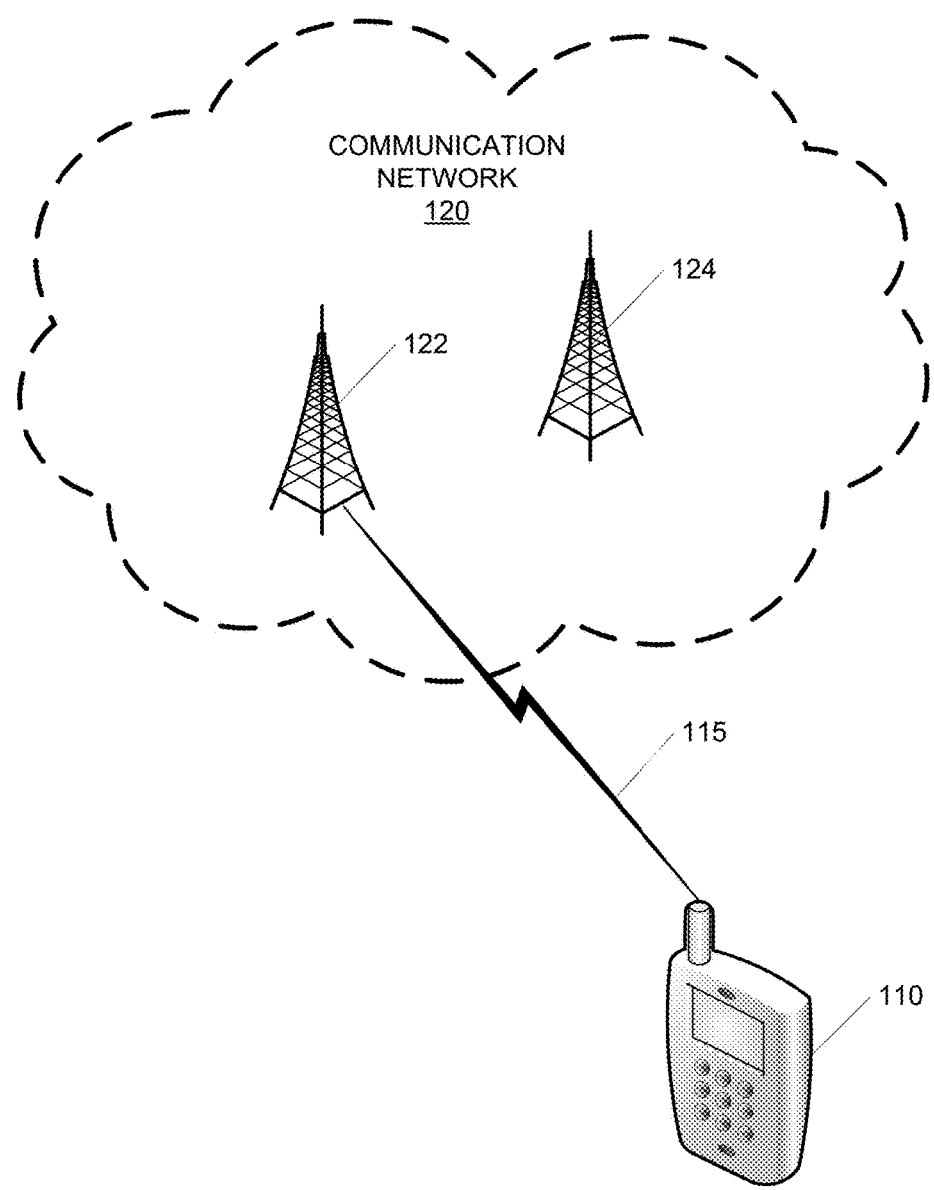
FIG. 1 is a system diagram illustrating a network environment according to various aspects of the present disclosure.

As seen in FIG. 1, a communication network 120 may be an LTE communication network. However, a person having ordinary skill in the art can appreciate that the communication network 120 may support different and/or additional radio access technologies (RATs), including, for example, but not limited to, wideband code division multiple access (WCDMA), global system for mobile communications (GSM), time division-synchronous code division multiple access (TD-SCDMA), and a 5th generation mobile network (5G) without departing from the scope of the present disclosure.

A mobile communication device 110 may communicate with the communication network 120 on a subscription 115 via the first eNodeB 122. For example, the mobile communication device 110 may transmit data to and receive data from the communication network 120 via the first eNodeB 122. A person having ordinary skill in the art can appreciate that the mobile communication device 110 may communicate with the communication network 120 on the subscription 115 via a different eNodeB (e.g., the second eNodeB 124) without departing from the scope of the present disclosure. Moreover, a person having ordinary skill in the art can appreciate that the mobile communication device 110 may communicate with different and/or additional communication networks on the subscription 115 and/or a different subscription without departing from the scope of the present disclosure.

Figure 2:
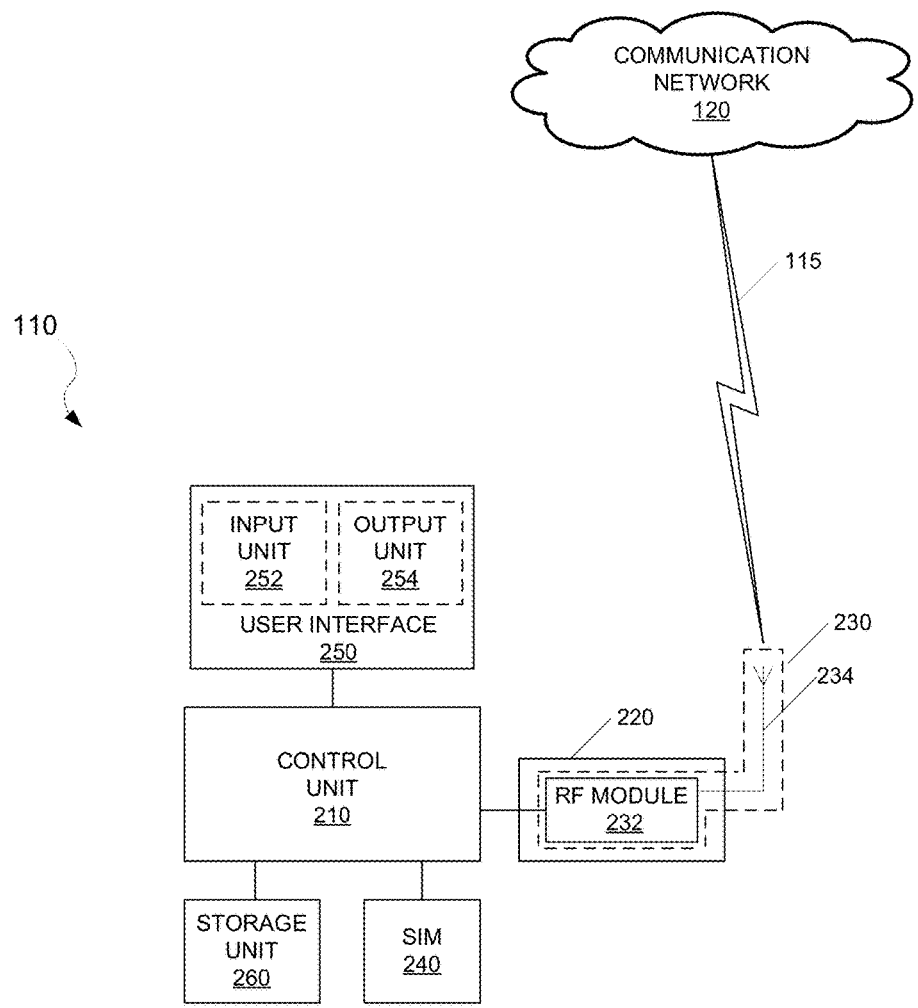
FIG. 2 is a block diagram illustrating a mobile communication device according to various aspects of the present disclosure.

FIG. 2 is a block diagram illustrating an exemplary mobile communication device 110 in accordance with aspects of the present disclosure. Referring to FIGS. 1 and 2, the mobile communication device 110 may include a control unit 210, a communication unit 220, a subscriber identity module (SIM) 240, a user interface 250, and a storage unit 260.

The mobile communication device 110 may be any device capable of wirelessly communicating with one or more communication networks including, for example, but not limited to, the communication network 120. The mobile communication device 110 may be, for example, but not limited to, a smartphone, a tablet PC, or a laptop computer.

The SIM 240 may associate the communication unit 220 with the subscription 115 on the communication network 120. Although the mobile communication device 110 is shown to include a single SIM (e.g., the SIM 240), a person having ordinary skill in the art can appreciate that the mobile communication device 110 may include additional SIMs without departing from the scope of the present disclosure. The additional SIMs may associate the communication unit 220 with a different subscription on the communication network 120 or a different communication network.

The SIM 240 may be a universal integrated circuit card (UICC) that is configured with SIM and/or universal SIM (USIM) applications, enabling access to GSM and/or UMTS networks. The UICC may also provide storage for a phone book and other applications. Alternatively, in a CDMA network, a SIM may be a UICC removable user identity module (R-UIM) or a CDMA subscriber identity module (CSIM) on a card. A SIM card may have a central processing unit (CPU), read-only memory (ROM), random-access memory (RAM), electrically erasable programmable read-only memory (EEPROM) and input/output (I/O) circuits. An integrated circuit card identity (ICCID) SIM serial number may be printed on the SIM card for identification. However, a SIM may be implemented within a portion of memory of the mobile communication device 110, and thus need not be a separate or removable circuit, chip, or card.

The communication unit 220 may include an RF chain 230. The RF chain 230 may include, for example, but not limited to, an RF module 232 and an antenna 234. Although the mobile communication device 110 is shown to include a single communication unit (e.g., the communication unit 220), a person having ordinary skill in the art can appreciate that the mobile communication device 110 may include additional communication units without departing from the scope of the present disclosure.

The user interface 250 may include an input unit 252. The input unit 252 may be, for example, but not limited to, a keyboard or a touch screen. The user interface 250 may further include an output unit 254. The output unit 254 may be, for example, but not limited to, a liquid crystal display (LCD) or a light emitting diode (LED) display. A person having ordinary skill in the art will appreciate that other types or forms of input and output units may be used without departing from the scope of the present disclosure.

The control unit 210 may be configured to control the overall operation of the mobile communication device 110 including controlling the functions of the communication unit 220 including, for example, but not limited to, frequency synthesis performed by the RF module 232. The control unit 210 may be, for example, but not limited to, a microprocessor (e.g., general-purpose processor, baseband modem processor, etc.) or a microcontroller.

The storage unit 260 may be configured to store application programs, application data, and user data. At least some of the application programs stored at the storage unit 260 may be executed by the control unit 210 for the operation of the mobile communication device 110.

Figure 3A:
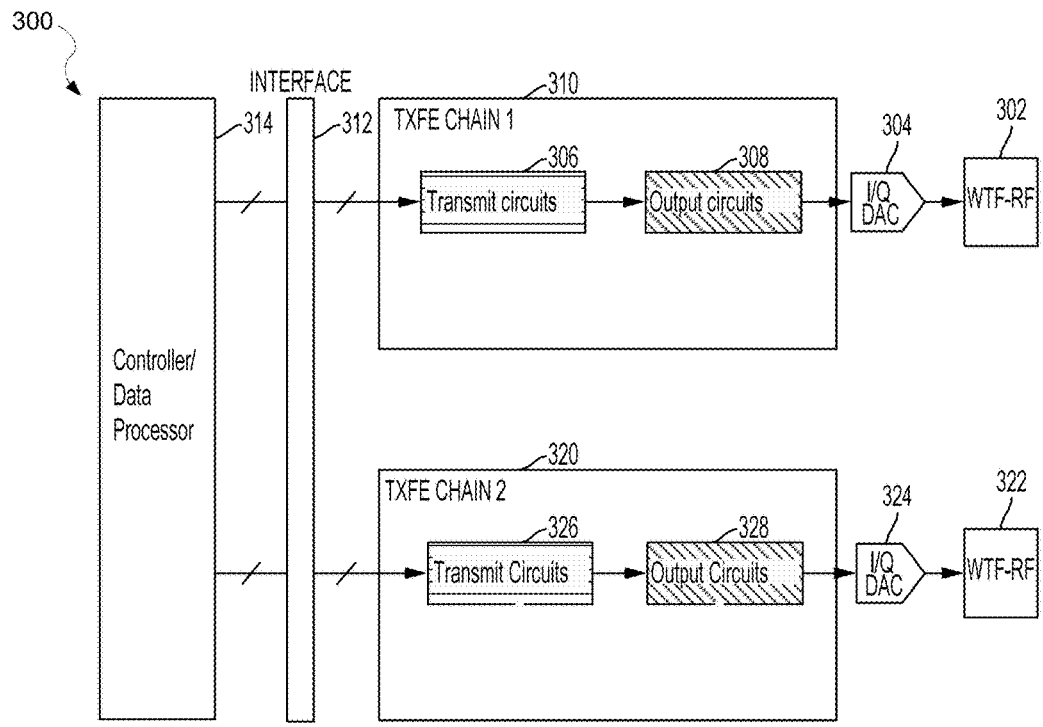
FIGS. 3A and 3B illustrate an exemplary wireless device according to aspects of the present disclosure.
Figure 3B:
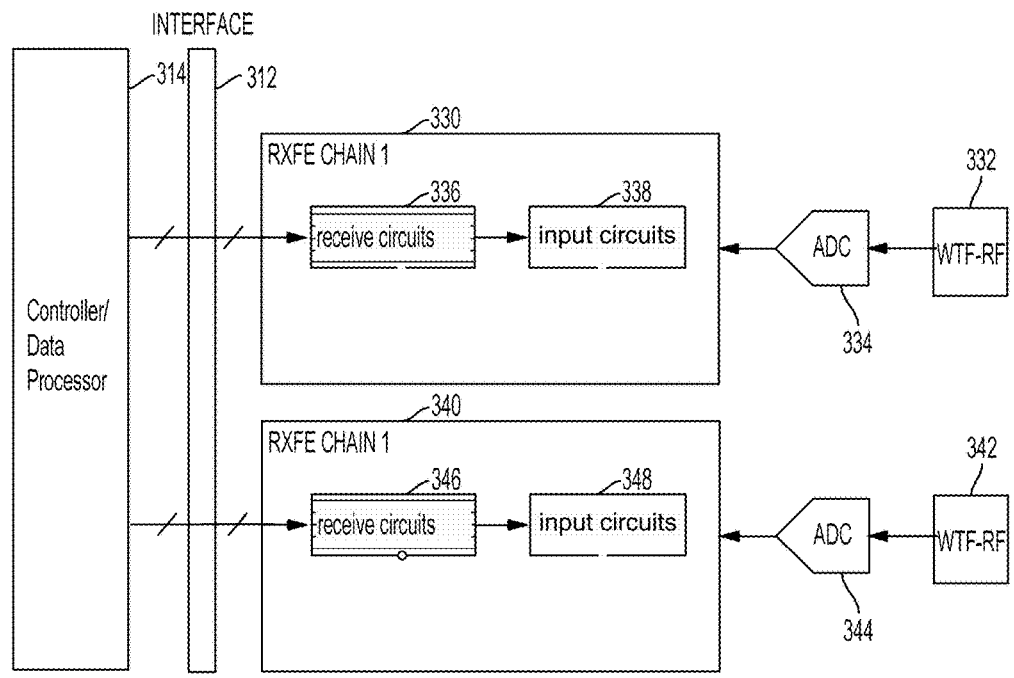

FIGS. 3A and 3B illustrate an exemplary wireless device 300 according to aspects of the present disclosure. The wireless device 300 includes a controller/data processor 314 and an interface 312 coupled to the controller/data processor 314. Signals representing data may be transmitted through multiple transmit chains via the interface 312. For example, a first transmit chain includes a first transmit front end (TXFE) chain 310 (e.g., a first baseband processor), a first digital to analog converter (DAC) 304, and a first wireless transceiver (WTR) 302. A second transmit chain includes a second transmit front end (TXFE) chain 320 (e.g., a second baseband processor), a second digital to analog converter (DAC) 324, and a second wireless transceiver (WTR) 322. Each of the TXFEs (e.g., 310 and 320) may include transmit circuits (e.g., 306, 326) and output circuits (e.g., 308, 328). The transmit circuits (e.g., 306, 326) amplify, filter, and upconvert the analog output signal from baseband to RF and provide a modulated RF signal. Transmit circuits (e.g., 306, 326) may include amplifiers, filters, mixers, matching circuits, an oscillator, an LO generator, a PLL, etc. A transmit RF signal may be output via output circuits (e.g., 308, 328), converted to an analog signal via a DAC (304, 324) supplied to a WTR (e.g., 302, 322) and transmitted via an antenna (not shown). Output circuits (e.g., 308, 328) may include a matching circuit, a transmit filter, a directional coupler, etc.

The wireless device 300 also includes multiple receive chains for receiving signals (e.g., radio frequency signals) to be processed by the wireless device 300 via the controller/data processor 314. For example, a first receive chain includes a first receive front end (RXFE) chain 330, a first analog to digital converter (ADC) 334, and a wireless transceiver (WTR) 332. A second receive chain includes a second receive front end (RXFE) chain 340, a second analog to digital converter (ADC) 344, and a wireless transceiver (WTR) 342. Each of the RXFEs (e.g., 330, 340) may include receive circuits (e.g., 336, 346) and input circuits (e.g., 338, 348). For data reception, an antenna (e.g., 234 of FIG. 2) receives signals (e.g., from base stations and/or other transmitter stations) and provides a received radio frequency (RF) signal to an ADC (e.g., 334, 344) which converts the received analog signal to a digital signal and supplies the converted signal to a selected RXFE (e.g., 330, 340). The converted signal is processed via input circuits (e.g., 338, 348), which provide an input RF signal to the receive circuits (e.g., 336, 346). Input circuits (e.g., 338, 348) may include a matching circuit, a receive filter, etc. The receive circuits (e.g., 336, 346) amplify, filter, and downconvert the output RF signal from RF to baseband and provide an analog input signal to a data processor. Receive circuits (e.g., 336, 346) may include mixers, filters, amplifiers, matching circuits, an oscillator, a local oscillator (LO) generator, a phase locked loop (PLL), etc.

In accordance with aspects of the present disclosure, the DACs (e.g., 304, 324) and the ADCs (e.g., 334, 344) may each be configured with multiple subunits. Each of the data converters (e.g., ADCs and DACs) may be configured to operate in accordance with a sampling frequency hopping process to improve the spurious free dynamic range of the wireless device 300. In some aspects, the hopping pattern may be based on a pseudorandom binary sequence (PRBS) or may be simply non-uniform, for example. Based on the hopping pattern, a phase selector may choose a specific sub-unit of the data converter. In some aspects, the phase selector choice may be driven by a finite state machine. In turn, the data converter may output samples that follow a random order. An output selector may then be used to sort the randomized output samples into a normal order.

In some aspects, the data converters (e.g., DACs (e.g., 304, 324) and the ADCs (e.g., 334, 344)) may also include one or more multi-phase clock generators coupled to each of the subunits separately to enable variable selectable clock phases.

Figure 4:
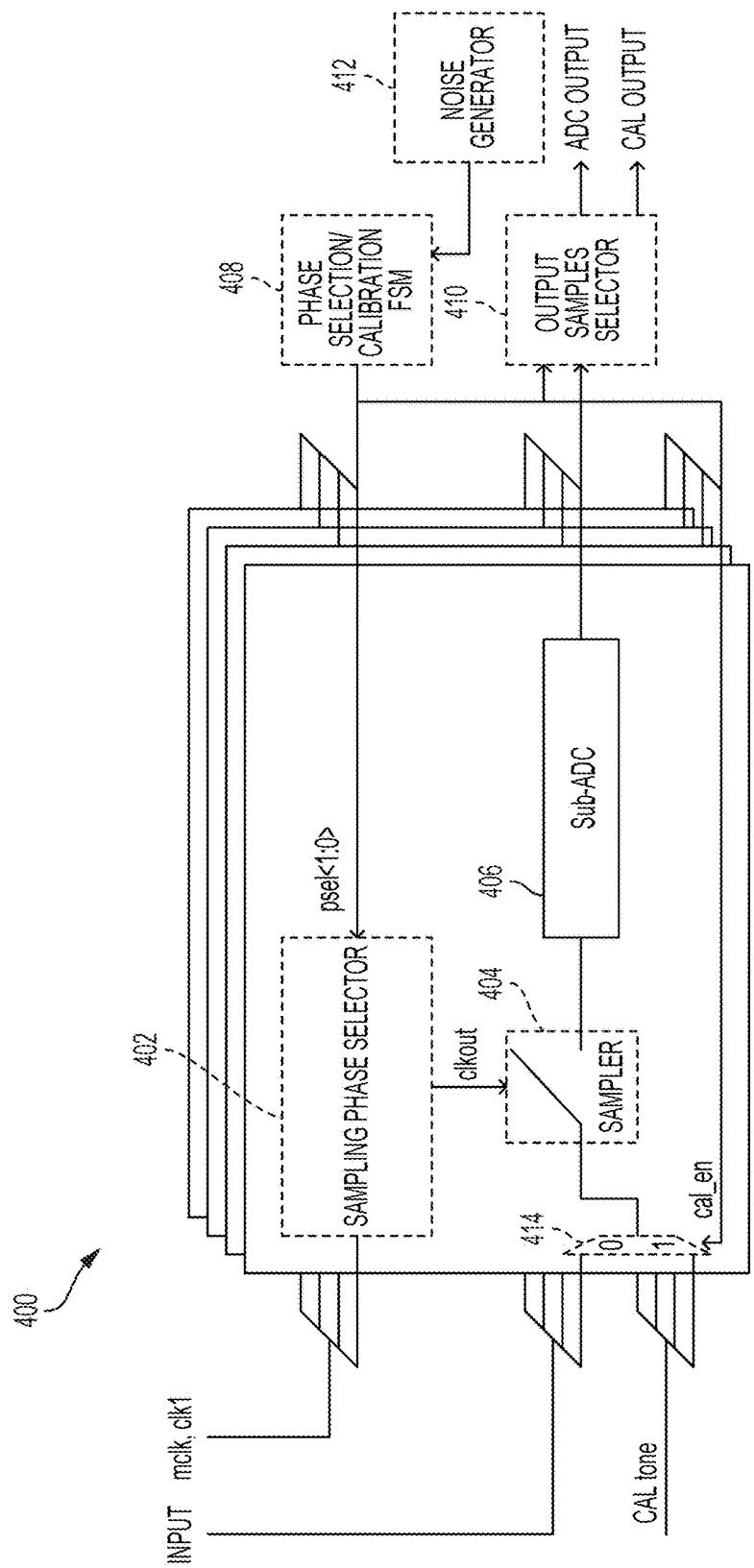
FIG. 4 is a block diagram illustrating an exemplary data converter in accordance with aspects of the present disclosure.

FIG. 4 is a block diagram illustrating an exemplary data converter 400 in accordance with aspects of the present disclosure. Referring to FIG. 4, the data converter 400 includes multiple subunits 406 (e.g., Sub-ADC), a phase selector 402, and a phase selection/calibration module 408. Each of the subunits 406 is configured to perform a data conversion operation. The data conversion operation may include the conversion of a signal from digital to analog or from analog to digital, for example. Further, each of the subunits may be configured to perform a data conversion at a rate given by $$f_a = \frac{f_s}{N - D},$$

where $f_s$ is the overall sampling rate, N is the total number of subunits, and D is a design parameter (e.g., degree of freedom that may be set to a value D≥1). Accordingly, the subunits may operate faster than conventional systems to enable non-uniform sampling.

The phase selection/calibration module 408 may generate a selection signal (e.g., psel<1:0>) to drive the phase selector 402 to select a subunit of the multiple subunits (e.g., 406) to perform a data conversion operation. The phase selection/calibration module 408 may generate a hopping frequency based, for example on a noise generator 412. In some aspects, the noise generator 412 may supply a non-periodic sequence. For example, the noise generator (e.g., pseudo-random number generator) may produce a pseudorandom binary sequence. Accordingly, the subunits may be operable according to a non-uniform timing. For instance, the subunits (e.g., 406) may be selected and may sample an input supplied by a multiplexor (MUX) 414 via a sampler 404 according to a hopping frequency that varies over time. The converted data signal may be output via an output module 410 and supplied to other components of a wireless communication device (e.g., WTR 322 of FIG. 3A) for further processing.

In addition, a background calibration process may be applied to further improve performance. For example, non-selected subunits of the data converter may be subjected to calibration during the period in which the selected subunit is active. The phase selection/calibration module 408 may enable calibrations by sending an enable signal (cal_en) to a MUX 414. The phase selection/calibration module 408 sends a selection signal to the phase selector 402 to select an idle subunit for calibration. Further, the phase selection/calibration module 408 may compute an adjustment (e.g., gain or timing skew) for the idle subunit. The computed adjustment may be applied to the idle subunit according to the calibration tone (CAL tone).

Figure 5:
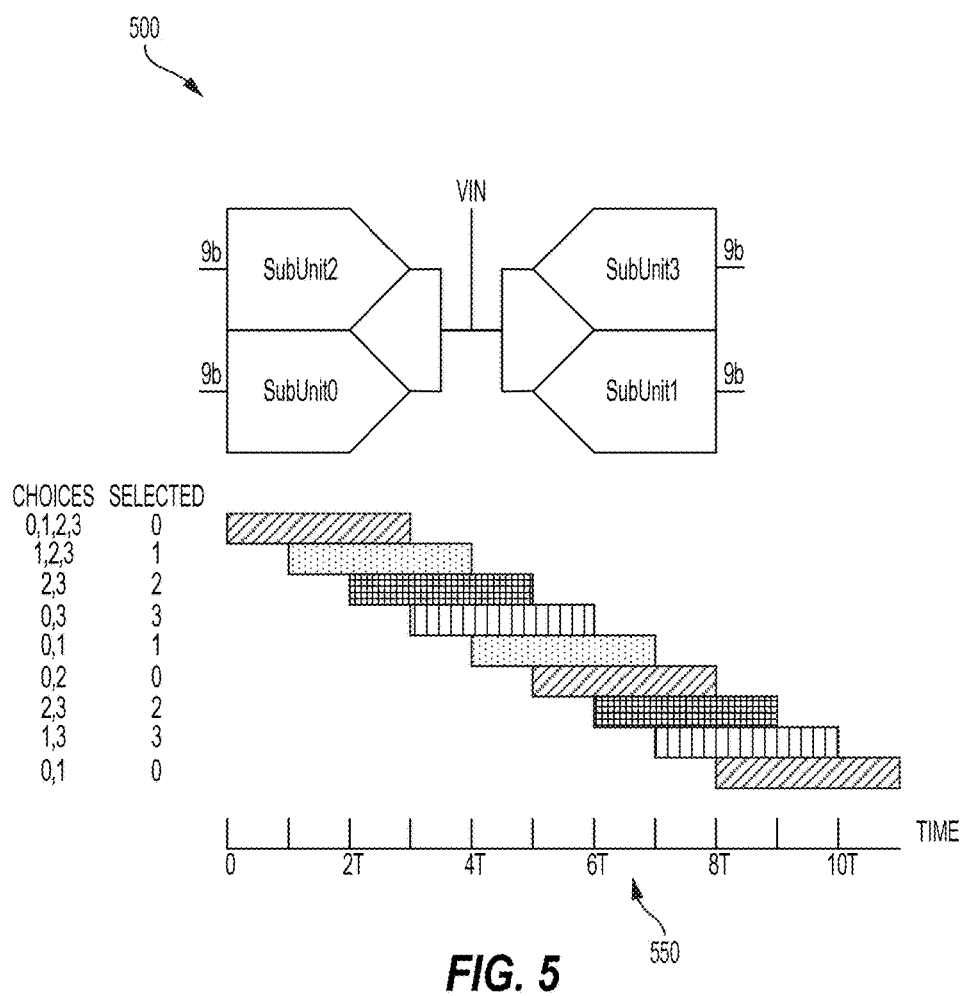
FIG. 5 illustrates an exemplary data converter and a timing diagram in accordance with aspects of the present disclosure.

FIG. 5 illustrates an exemplary data converter 500 and a timing diagram 550 in accordance with aspects of the present disclosure. The data converter 500 includes subunits 0-3. Although four subunits are shown, this is merely exemplary and not limiting. Each of the subunits are coupled to the voltage input signal (Vin) that may be applied when a particular subunit is performing a data conversion operation. As shown in the timing diagram 550, at the initial instance, all of the subunits are available for selection. In this example, selection for data conversion may initially proceed according to a natural order (e.g., 0, 1, 2, 3). However, because the sampling rate has been increased, at the third time step subunit 0 has completed its sampling task and is available for selection along with subunit 3. At time step 4, subunits 0 and 1 are available for selection. At each time step, there are two or more subunits available for selection.

The available subunits may be selected according to a non-uniform sequence. In some aspects, the selection may be random, such as based on a pseudorandom binary sequence (PRBS), for example. Each subunit has a sampling rate in the range of fs/3 and 0. That is, if a subunit is always selected, its sampling rate is fs/3 and if it is never selected, the subunit's sampling rate would be 0. In some aspects, the sampling rate may hop in the range set by these limits. Accordingly, the subunits may selectively sample the input in a non-uniform manner rather than at fixed or periodic intervals. For example, subunit 0 is selected at time steps 0T, 5T, and 8T. By implementing hopping in this manner, the tones or errors produced by the data converters (e.g., ADC) may be spread over a wide spectrum to improve SFDR performance.

Figure 6A:
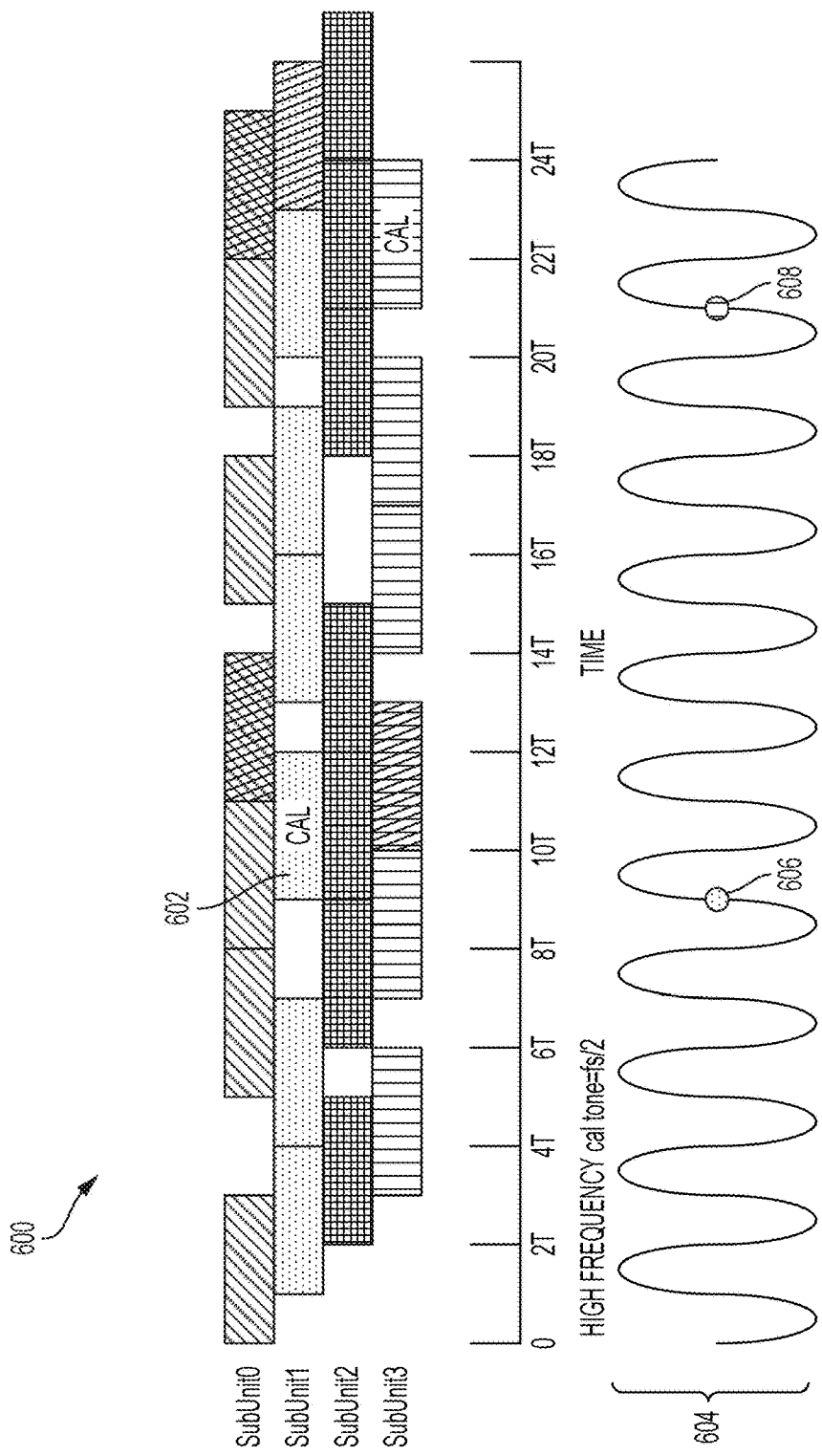
FIG. 6A is a timing diagram illustrating background calibration in accordance with aspects of the present disclosure.

FIG. 6A is a timing diagram 600 illustrating background calibration in accordance with aspects of the present disclosure. Referring to FIG. 6A, an idling subunit (a subunit that is not performing a conversion) may be calibrated. At time period 9T, subunit 1 is idle, while the remaining subunits are operating. During this time step, subunit 1 may be calibrated (602). In this example, a calibration process may be performed at multiples of the calibration tone 604 (e.g., every 12 time steps). When a subunit enters calibration, it may not be available for normal operation (e.g., data conversion) until the calibration process is completed. As a result, the periodic lack of freedom creates spurs at the calibration frequency.

Figure 6B:
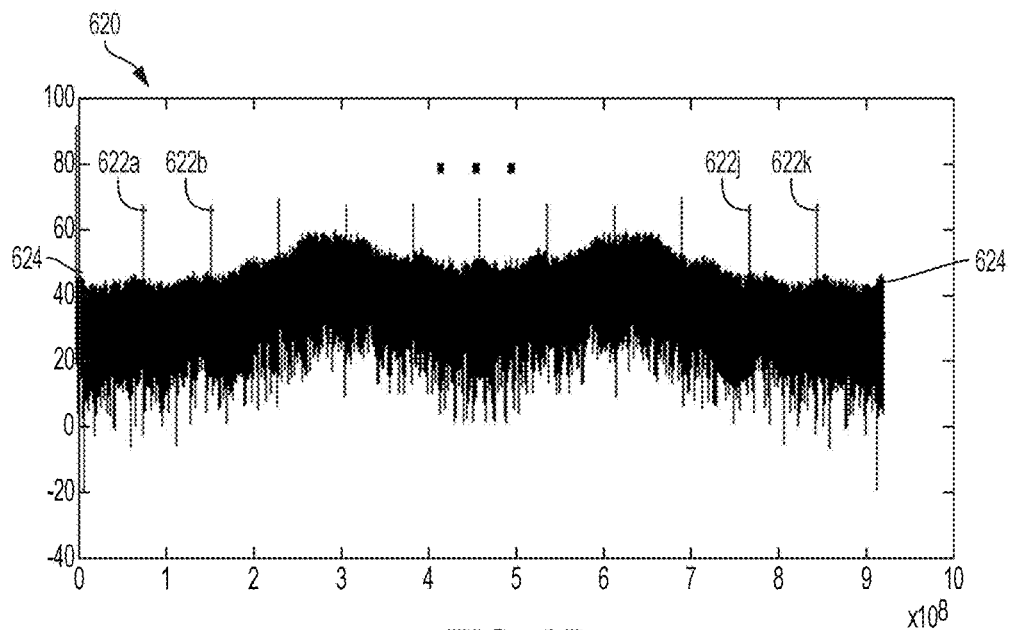
FIG. 6B illustrates an example spectrum of a sequence of delta functions representing the sampling instants of a subunit when the calibration frequency is fs/12 in accordance with aspects of the present disclosure.
Figure 6C:
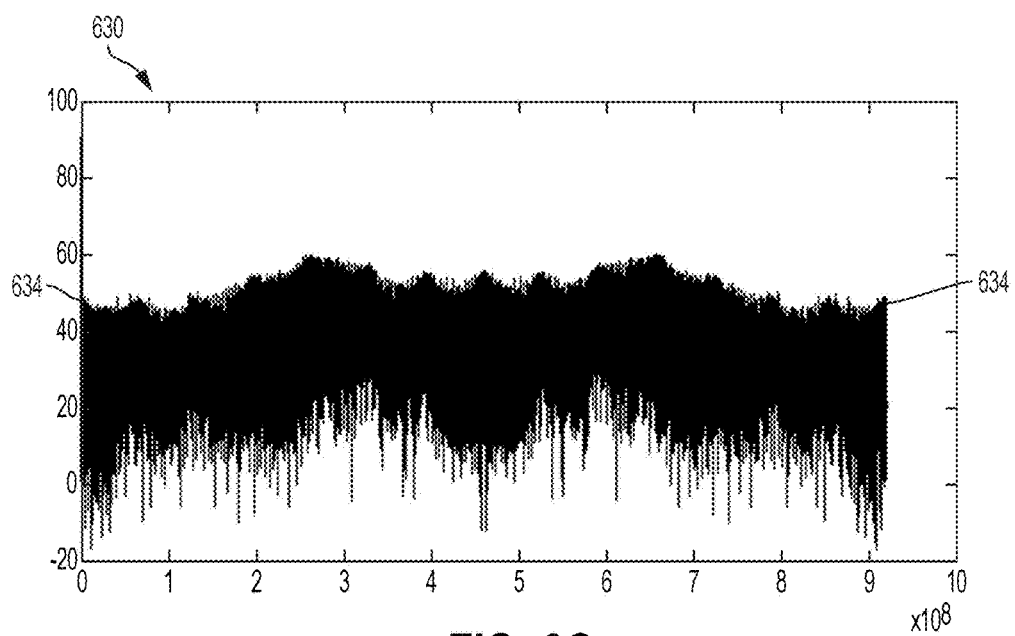
FIG. 6C illustrates an example spectrum of a sequence of delta functions representing the sampling instants of a subunit when the calibration frequency is fs/192 in accordance with aspects of the present disclosure.

FIG. 6B shows an example spectrum 620 of a sequence of delta functions representing the sampling instants of a subunit with a calibration frequency at fs/12 where spurs (e.g., 622a-k) rise above noise floor 624. FIG. 6C shows another example spectrum 630 of a sequence of delta functions representing the sampling instants of a subunit with a calibration frequency at fs/192 where spurs fall below noise floor 634. By spacing out the calibration procedures, the calibrations occur less frequently, and the spur energies may be reduced. In some aspects, the calibrations may be spread such that the spurs fall below the noise floor thereby improving SFDR and/or SNR. Additionally, the calibrations may be performed at points of the highest slope (606, 608) for improved sensitivity. Of course, the sampling instants, delta functions, and calibration frequencies are merely exemplary and are presented for illustrative purposes and not limitation.

Figure 7:
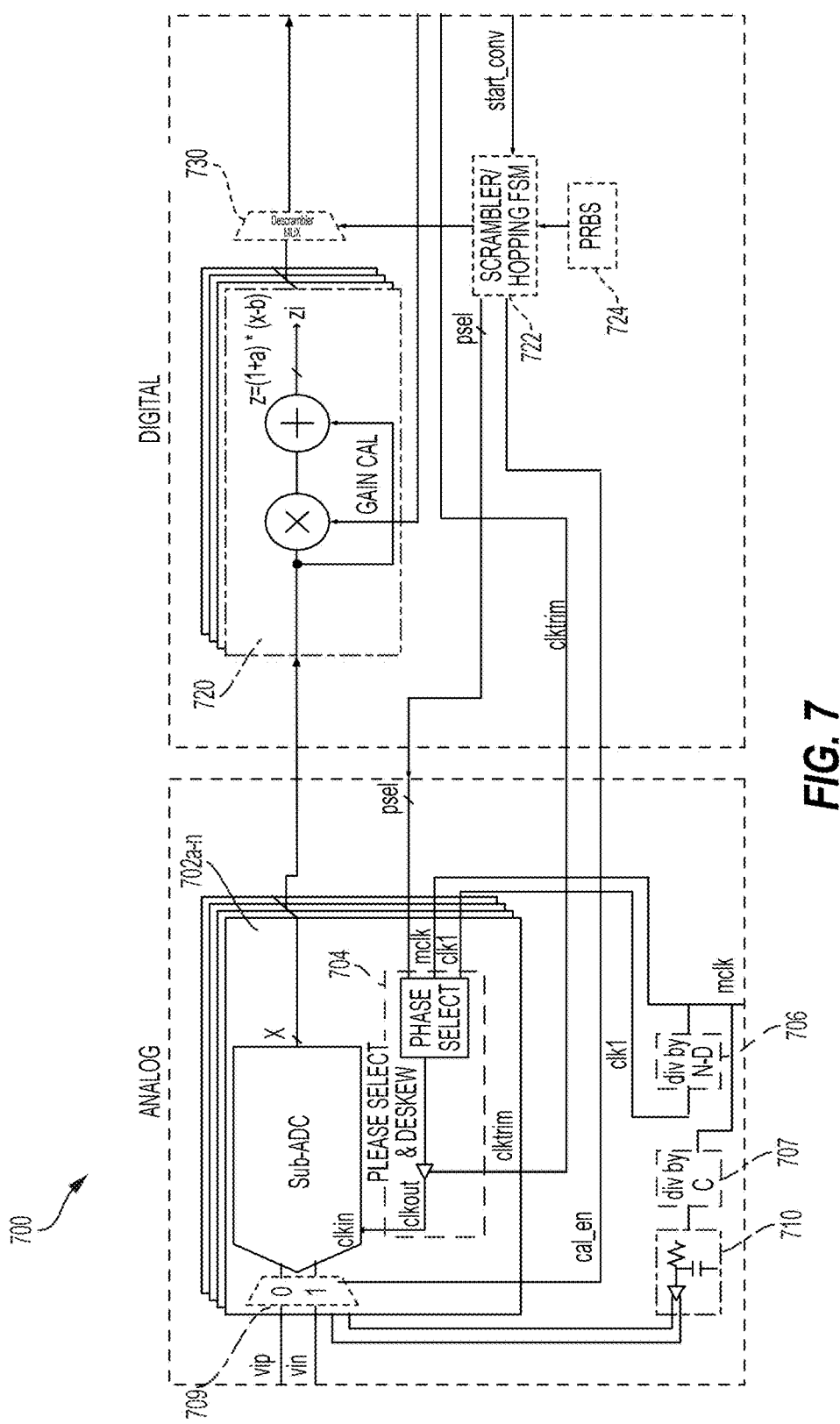
FIG. 7 is a block diagram illustrating an exemplary architecture for data conversion with background calibration in accordance with aspects of the present disclosure.

FIG. 7 is a block diagram illustrating an exemplary architecture 700 for data conversion with background calibration in accordance with aspects of the present disclosure. The exemplary architecture 700 includes multiple subunits (e.g., sub-ADC 702a-n), a phase select module 704, a calibration module 720, and a scrambler module 722. In some aspects, each subunit (e.g., sub-ADC 702a-n) may have a corresponding calibration module 720 to correct different gain errors for each of the subunits. Each of the subunits (e.g., 702a-n) is configured to perform a data conversion operation. For example, the subunits (e.g., 702a-n) may convert an analog input to a digital input and vice versa. The scrambler module 722 supplies a signal (psel) that is used to drive the phase select module 704. The phase select module 704, in turn selects a subunit (e.g., 702a-n) according to the selected phase (psel) to perform a data conversion operation. In some aspects, the subunits (e.g., 702a-n) may be selected in a non-uniform manner. For example, the subunits may be selected to perform a data conversion according to a hopping frequency that varies as determined via the scrambler module 722 using a pseudo-random binary sequence module 724, for instance. A descrambler module 730 may, in some aspects be used to return to a natural order.

The calibration module 720 corrects for gain errors. When a subunit (e.g., 702a-n) is selected for calibration (e.g., when idle), a start calibration signal (start_cal) is provided to the calibration module 720. An adjustment signal may be supplied to the phase select module 704. The phase select module 704 may select the subunit (e.g., 702a-n) for calibration based on the adjustment signal at a timing based on the master clock (mclk) supplied via the clock module 706, the synchronization clock (clk1), and the phase select signal (psel). The selected subunit for calibration may be designated via MUX 709. In this exemplary architecture, the synchronization clock clk1 is generated by dividing the master clock mclk by N-D, where N is the number of subunits and D is a design parameter (e.g., N=4, D=1, so frequency of clk1 is a third of the frequency of mclk). The divider 707 divides the master clock (Mclk) by an integer C (e.g., C=2, 12, 192) and sends a digital output calibration tone to the analog filter 710 to generate a differential analog calibration signal.

Table 1 below describes exemplary pseudocode for background calibration of the data conversion subunits. In the exemplary pseudocode, the gain and the timing skew are co-calibrated iteratively such that the timing skew and gain calibrations converge simultaneously, where N is the number of channels, P is the number of phases to measure, T is the number of timing skew trim bits, and the input calibration cosine wave frequency is fs/P.

TABLE 1

| | |
|---|---|
| 1. | For each channel, do gain calibration as follows: |
| A. | measure all P phases using 64-sample averaging, compute mean of all P phases and subtract mean from all P phases to eliminate residual offset |
| B. | compute energy using sum of squares of each phase, and next compute additional gain correction beyond current gain correction. Then, update the gain calibration register. |
| C. | if the additional gain correction is smaller than a threshold and timing skew trim is done, then goto 4 |
| 2. | For each channel 2 to N, do successive approximation timing skew calibration as follows: |
| A. | set timing trim register to zero |
| B. | for I = T − 1 to 0, |
| C. | set timing trim bit I to 1, measure output and compare to channel 1 at phase P*0.75, where slope is highest. If output is larger, then skew is positive, so set timing trim bit I to 0 to reduce the skew |
| D. | proceed to next I by going to 2C |
| E. | timing skew trim done |
| 3. | Go to 1 |
| 4. | Both gain and timing skew calibrations converged. |

Figure 8A:
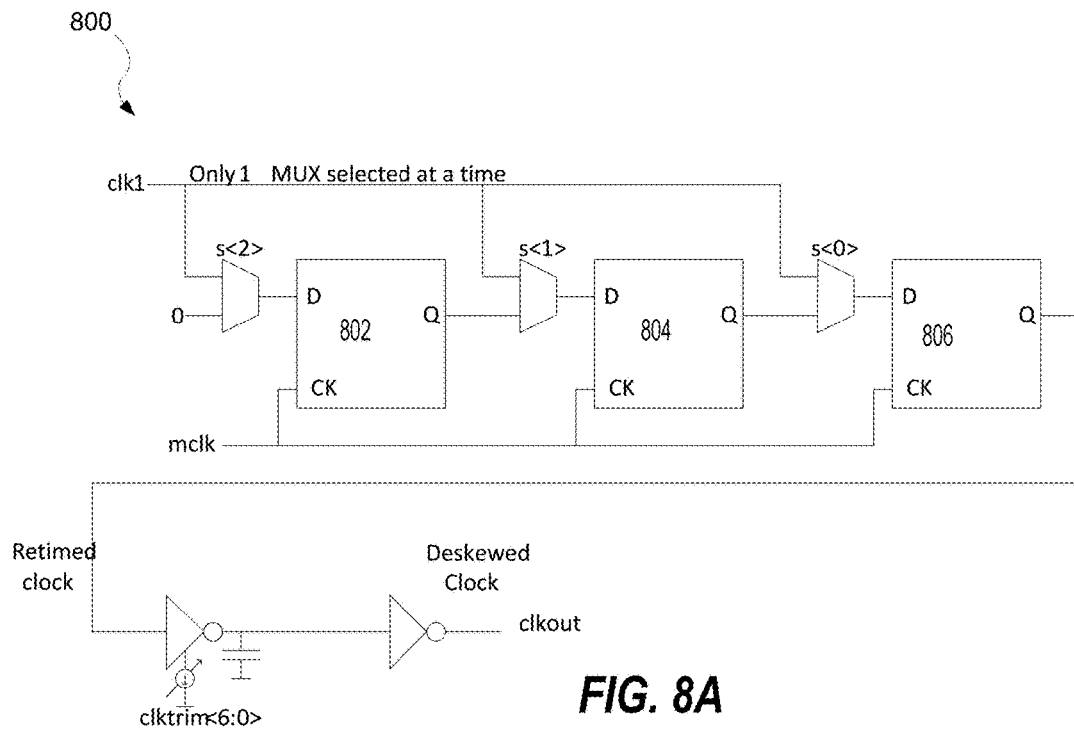
FIG. 8A is a block diagram illustrating an exemplary programmable phase selector in accordance with aspects of the present disclosure.

FIG. 8A is a block diagram illustrating an exemplary programmable phase selector 800 in accordance with aspects of the present disclosure. The phase selector 800 includes multiple D-flip flops (e.g., 802, 804, 806). Each of the D-flip flops is supplied with a synchronization clock signal (clk1) via a MUX (e.g., s<2>, s<1>, and s<0>) coupled to the input. In this way, the synchronization clock signal may be applied to control the MUXes (e.g., s<2>, s<1>, and s<0>) such that one MUX is selected at a time. A variable delay set by clktrim<6:0> deskews the clock to produce the clock output (clkout) for sampling. The retimed clock, Q of FF 806, rises immediately after the rising edge of mclk, independent of the arrival time of D input which may have a lot of jitter. So, Q may be retimed to mclk, which has much less jitter. The variable delay set by clktrim<6:0> delays the output clock clkout in each subunit such that the clkout's in all subunits line up (e.g., time aligned or synchronized).

Figure 8B:
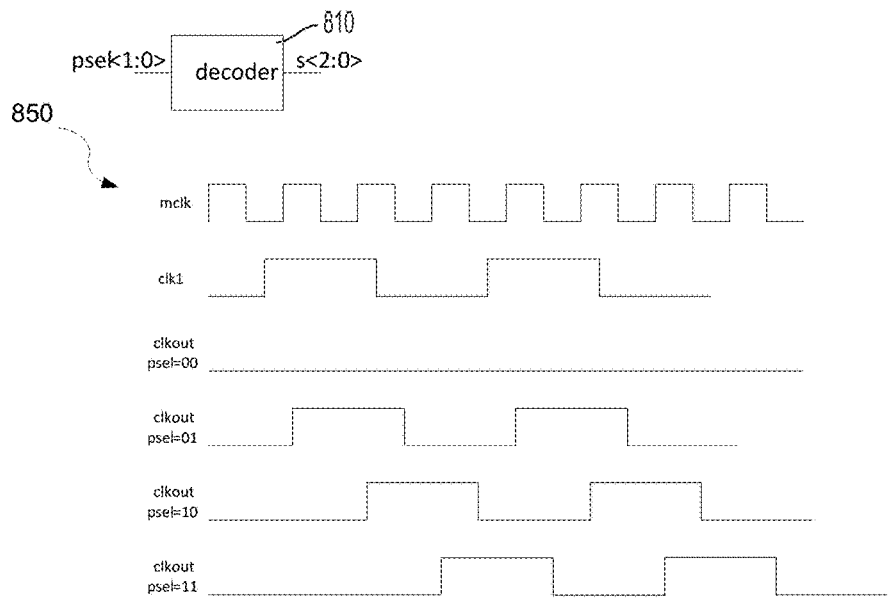
FIG. 8B is a timing diagram illustrating operation of the programmable phase selector in accordance with aspects of the present disclosure.

FIG. 8B is a timing diagram 850 illustrating operation of the programmable phase selector 800 in accordance with aspects of the present disclosure. As shown in FIG. 8B, when the synchronization signal goes high a selected MUX supplies an input signal to a corresponding D-flip flop. Based on the setting of the selection signal psel<1:0>, none or one phase of the master clock (mclk) is used for sampling the input. The output of the last D flip flop 806 goes high after p rising edges of the master clock, where p is set by the selection signal (psel<1:0>). In some aspects, if p is equal to zero, the sub-ADC may not be used. In turn, a clock output (e.g., the desired phase) is output at the next rising edge of the master clock signal (mclk).

Table 2 is a truth table for determining the selection signal via a decoder 810. The values included in the truth table are exemplary only and not limiting. If the two bit value psel<1:0>=p, then the clkout signal will rise after p rising edges of mclk. For instance, as shown in Table 2, if psel<1:0>=01 then the decoder 810 outputs s<2:0>=001 and the clkout signal will rise after 1 rising edge of mclk. If a subunit's clkout goes from low to high at time T, then the corresponding subunit is selected at time T.

TABLE 2

| s<2:0> | psel<1:0> |
|---|---|
| 000 | 00 |
| 001 | 01 |
| 010 | 10 |
| 100 | 11 |

Figure 9:
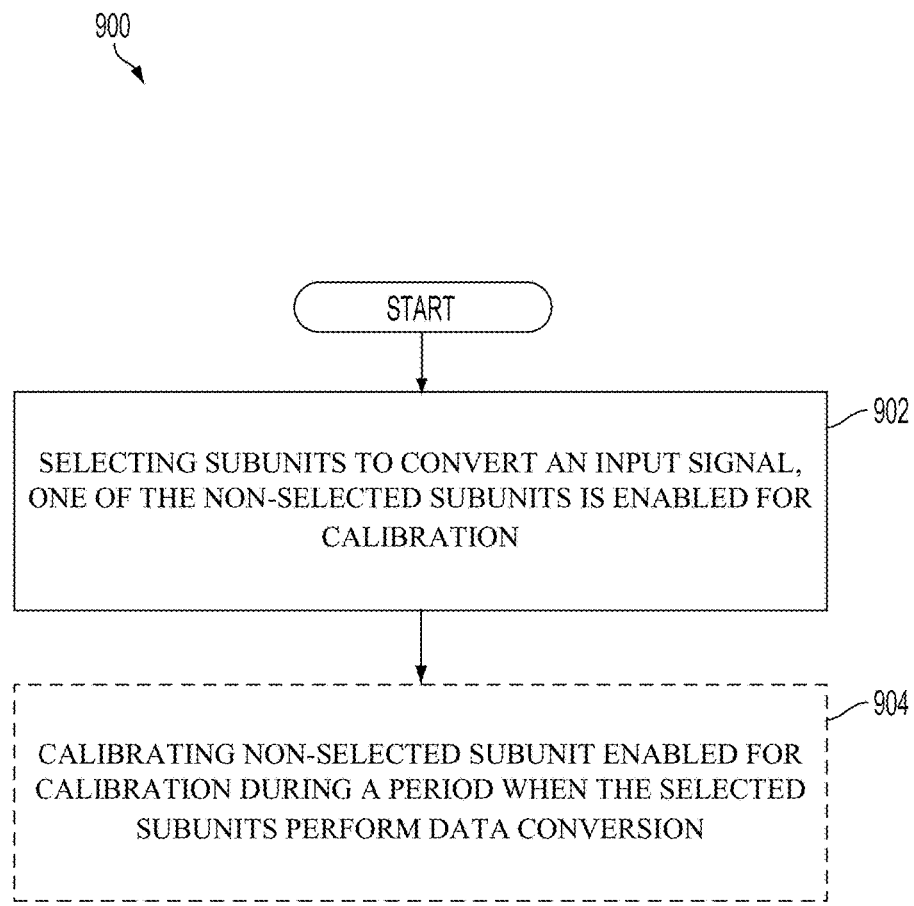
FIG. 9 is a process flow diagram illustrating a method for data conversion in accordance with aspects of the present disclosure.

FIG. 9 is a process flow diagram illustrating a method 900 for data conversion in accordance with aspects of the present disclosure. At block 902, the process simultaneously selects multiple subunits to convert an input signal. The subunits are selected (e.g., sampled) according to a variable hopping frequency. At least two of the selected subunits are enabled at a same time. Additionally, one of the subunits (e.g., an unselected subunit) is enabled for calibration. In some aspects, the variable hopping frequency is random. For example, the variable hopping frequency may be determined via a pseudorandom binary sequence (PRBS). The input signal may comprise a radio frequency signal, for instance. The data conversion may comprise a digital to analog conversion or an analog to digital conversion.

At block 904, the process optionally calibrates the non-selected subunit enabled for calibration during the period in which the selected subunits perform the data conversion. In some aspects, the calibration includes a gain calibration process (e.g., the calibration process shown in Table 1). In other aspects, the calibration includes a timing skew calibration process (e.g., the calibration process shown in Table 1).

According to a further aspect of the present disclosure, a data converter is described. The data converter includes a means for simultaneously selecting multiple subunits to convert an input signal. The means for selecting may, for example, comprise the controller data processor 314, as shown in FIG. 3, the control unit 210 as shown in FIG. 2, the phase selector 402 of FIG. 4, and the programmable phase selector 800 as shown in FIG. 8. The data converter also includes means for calibrating the non-selected subunits during the period in which the selected subunits perform the data conversion. The means for calibrating the non-selected subunits may, for example, comprise the controller data processor 314, as shown in FIG. 3, the control unit 210 as shown in FIG. 2, the calibration module 720, and adjustment module 726 as shown in FIG. 7. In another aspect, the aforementioned means may be any module, or any apparatus configured to perform the functions recited by the aforementioned means.

Figure 10:
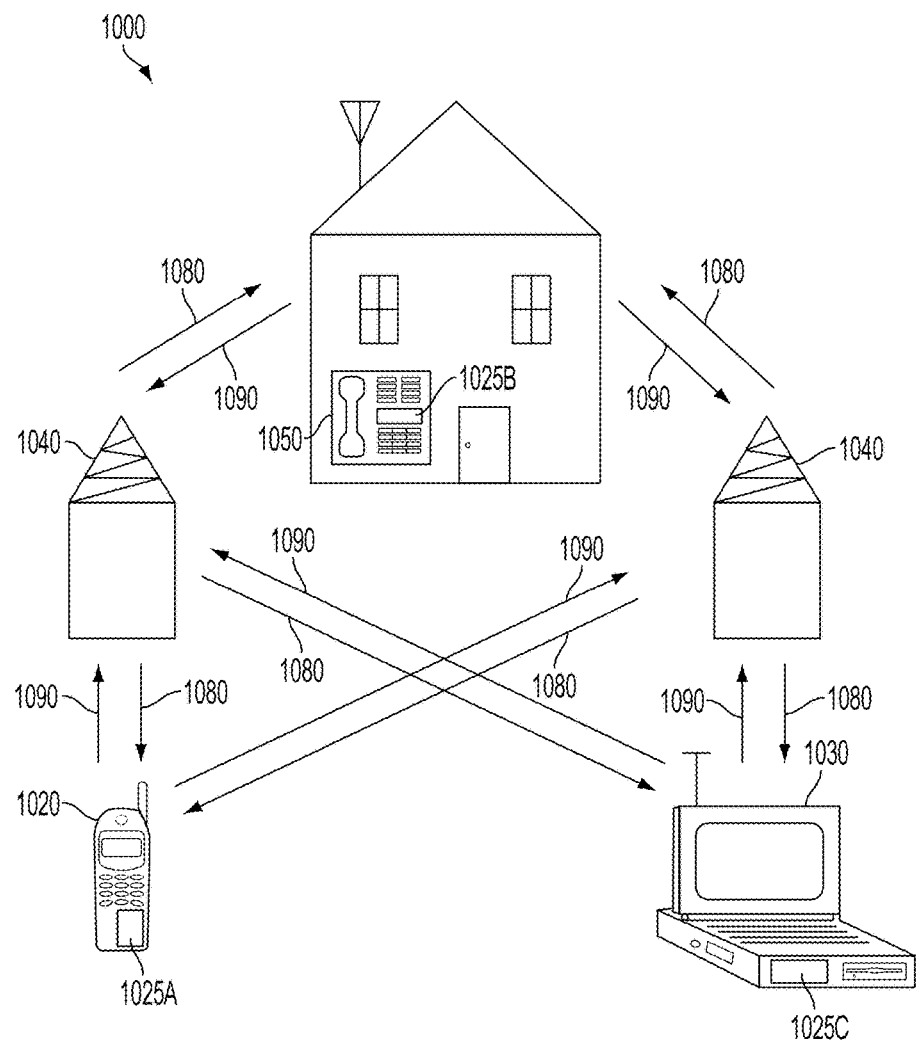
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B having the disclosed data converter. It will be recognized that other devices may also include the disclosed data converter, such as the base stations, user equipment, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed data converter.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A data converter comprising:
a plurality of subunits configured to convert an input; and
a scrambler configured to select the plurality of subunits to sample the input in an order that varies over time, at least two subunits of the plurality of subunits enabled at a same time.

2. The data converter of claim 1, in which an idle subunit is enabled for calibration.

3. The data converter of claim 1, in which a selection order is determined according to a pseudorandom number generator.

4. The data converter of claim 3, in which the at least two subunits sample at least one of the input or a calibration signal during the same time interval.

5. The data converter of claim 1, further comprising a plurality of multi-phase clock generators coupled to each of the subunits separately and having variable selectable clock phases.

6. The data converter of claim 1, in which the input comprises a radio frequency signal and a selected subunit is configured to convert the input from an analog signal to a digital signal.

7. The data converter of claim 1, in which the input comprises a radio frequency signal, and a selected subunit is configured to convert the input from a digital signal to an analog signal.

8. A method for data conversion, comprising:
simultaneously selecting a plurality of subunits to convert an input signal, the plurality of subunits selected, by a scrambler, according to a variable hopping frequency, one of the plurality of subunits enabled for calibration.

9. The method of claim 8, in which the input signal comprises a radio frequency signal and in which the radio frequency signal is converted from an analog signal to a digital signal.

10. The method of claim 8, in which the input signal comprises a radio frequency signal and in which the radio frequency signal is converted from a digital signal to an analog signal.

11. The method of claim 8, in which the variable hopping frequency is random.

12. The method of claim 11, further comprising determining the variable hopping frequency according to a pseudorandom number generator.

13. The method of claim 8, further comprising calibrating non-selected subunits during a period in which a selected subunit performs data conversion.

14. The method of claim 13, in which the calibrating includes calibrating timing skew and gain error for each of the non-selected subunits.

15. A data converter comprising:
means for simultaneously selecting a plurality of subunits to convert an input signal, the plurality of subunits selected according to a variable hopping frequency, one of the plurality of subunits enabled for calibration; and
means for calibrating non-selected subunits during a period in which the selected subunits perform data conversion.

16. The data converter of claim 15, in which the input signal comprises a radio frequency signal and in which the radio frequency signal is converted from an analog signal to a digital signal.

17. The data converter of claim 15, in which the input signal comprises a radio frequency signal and in which the radio frequency signal is converted from a digital signal to an analog signal.

18. The data converter of claim 15, in which the variable hopping frequency is random.

19. A wireless communication device, comprising:
 a data converter, comprising a plurality of subunits configured to convert an input, and
 a scrambler configured to select the plurality of subunits in an order that varies over time, at least two subunits of the plurality of subunits enabled at a same time.

20. The wireless communication device of claim 19, in which a selection order is determined according to a pseudorandom number generator.

21. The wireless communication device of claim 19, in which the at least two subunits sample at least one of an input signal or a calibration signal during the same time interval.

22. The wireless communication device of claim 19, further comprising a plurality of multi-phase clock generators coupled to each of the subunits separately and having variable selectable clock phases.

23. The wireless communication device of claim 19, in which the input comprises a radio frequency signal and a selected subunit is configured to convert the input from an analog signal to a digital signal.

24. The wireless communication device of claim 19, in which the input comprises a radio frequency signal and a selected subunit is configured to convert the input from a digital signal to an analog signal.

* * * * *